Sept. 21, 1965 H. F. COOKE ETAL 3,207,989

AUTOMATIC FREQUENCY CONTROL SYSTEM

Filed Jan. 24, 1961

Harry F. Cooke,
Floyd C. Ducote,
Dale W. Parsons,
Inventors.
Koenig and Pope,
attorneys.

3,207,989

AUTOMATIC FREQUENCY CONTROL SYSTEM

Harry F. Cooke, Richardson, Tex., Floyd C. Ducote, San Pedro, Calif., and Dale W. Parsons, Dallas, Tex., assignors to Texas Instruments Incorporated, Dallas, Tex., a corporation of Delaware Filed Jan. 24, 1961, Ser. No. 84,537
2 Claims. (Cl. 325—420)

Figures 1, 2:
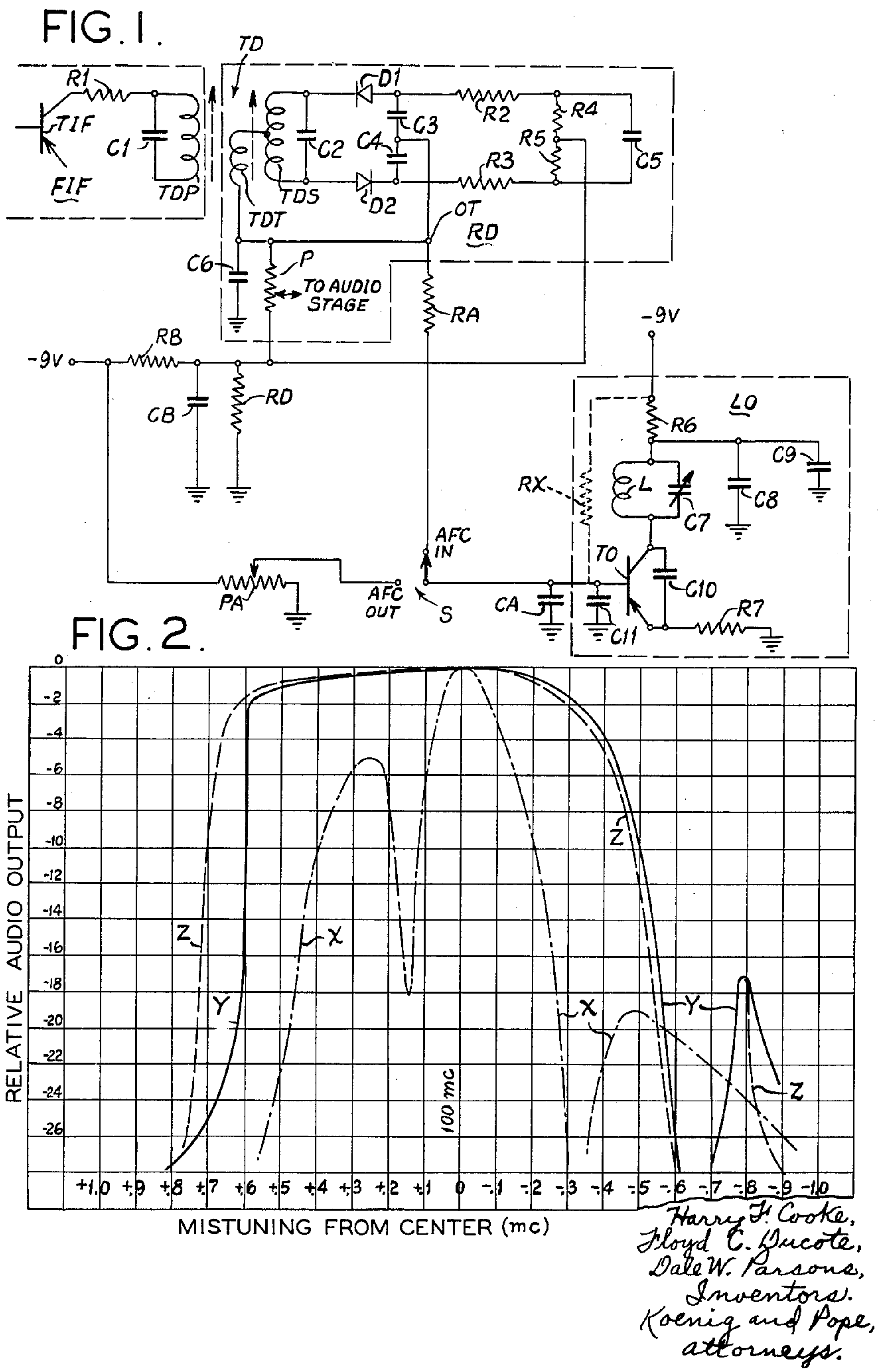

This invention relates to automatic frequency control systems for FM receivers and more particularly to such AFC systems for FM receivers utilizing transistor oscillators.

Among the several objects of the invention may be noted the provision of an AFC system for FM receivers having transistor oscillators which will automatically control frequency without the use of additional active or nonlinear elements; the provision of an AFC system of the class described in which a minimum of additional components are utilized; the provision of an AFC system which employs conventional components including the customary types of transistors used for high frequency oscillators; and the provision of such an AFC system which is reliable and accurate in operation and economical in construction. Other objects and features will be in part apparent and in part pointed out hereinafter.

The invention accordingly comprises the constructions hereinafter described, the scope of the invention being indicated in the following claims.

In the accompanying drawing, in which one of various possible embodiments of the invention is illustrated, FIG, 1 is a circuit diagram of one embodiment of an AFC system of the present invention; and FIG. 2 is a graphical representation of the tuning characteristics of an FM receiver with and without operation of an exemplary AFC system of this invention.

A number of systems have been employed in the past for automatically controlling the reception frequency of FM receivers of both vacuum tube and transistor circuitry. These systems have used an additional vacuum tube as a variable capacitor, an extra diode as a voltage sensitive capacitor or voltage sensitive inductor, or capacitors to effect automatic frequency control. In accordance with the present invention we have accomplished automatic control of frequency without the use of such additional nonlinear or active elements by varying the base voltage of the transistor local oscillator in response to a D.C. voltage component from the detector stage of the FM receiver, which voltage component is proportional to the magnitude of deviation or mistuning of the receiver frequency from a preselected desired frequency.

Referring now more particularly to FIG. 1, the final IF, or intermediate frequency amplifier stage of an FM receiver, is indicated generally at reference character FIF. This stage, which is of conventional transistor IF amplifier circuitry, includes a customary transistor TIF, a resistor R1, a tuned LC tank circuit constituted by a capacitor C1 and an inductor TDP comprising the primary winding of a ratio detector transformer TD. The output IF signal developed by FIF is inductively coupled to a secondary winding TDS and a tertiary winding TDT of the ratio detector transformer TD. A conventional ratio detector stage of an FM receiver is indicated generally by RD and includes in addition to the windings TDS and TDT a capacitor C2, two diodes D1 and D2, two capacitors C3 and C4, two pairs of resistors R2, R3 and R4, R5, another capacitor C5, a potentiometer P, which constitutes a volume or gain control for the FM receiver, and an R-F by-pass capacitor C6. As is the usual practice, the capacitance parameters of C3 and C4 and the resistance parameters of R4 and R5 are respectively made equal, and the values of R4, R5 and C5, which constitute an RC circuit, are selected to make the time constant thereof long relative to the lower audio frequencies, e.g., in the order of .2 second. The output or detected audio signal of the ratio detector is present on an output terminal OT relative to circuit ground. The output may be impressed across the resistance constituted by potentiometer P, the rotor of which is interconnected (usually via a deemphasis network) to the input terminal of the first audio amplifier stage (as indicated but not shown in detail) or potentiometer P can be replaced by a fixed resistor and the output taken from point OT directly to the first audio frequency amplifier.

A conventional local transistor oscillator stage is illustrated generally at reference character LO. This stage includes a transistor TO connected in a common-emitter configuration with an LC tank circuit (constituted by an inductor L and a variable capacitor C7). This tank circuit, a decoupling resistor R6, and a biasing resistor R7 are serially connected with a D.C. power source (represented at —9 v., the positive polarity terminal thereof being connected to circuit ground) in the collector-emitter circuit of TO. Two capacitors C8 and C9 are connected from the junction of the LC tank circuit and R6 to ground. The local oscillator also includes a capacitor C10, which functions to feed back in-phase R-F energy from the collector to the emitter electrode to sustain oscillation, and a capacitor C11 which interconnects the base electrode of TO to circuit ground to provide an R-F return.

The circuit components and physical association of oscillator stage LO as described so far are conventional. In accordance with the present invention, two departures from customary design are made. First, the resistance of R6 is increased somewhat over the usual value to enhance the collector voltage variation in response to change of collector current. Second, the base electrode which is conventionally connected to a fixed bias voltage source, usually to a fixed voltage divider resistance, is connected instead to the output terminal OT of detector stage RD via an isolating resistor RA.

The local oscillator performs its usual function of providing an R-F signal of a frequency which is adjustable to be equal to the frequency of the carrier signal of the particular FM station to be received plus or minus the IF frequency. This output R-F signal of the local oscillator is coupled by any conventional means (not shown), such as capacitively or inductively, to the customary mixer or converter stage of the FM receiver, which has an output signal the frequency of which is equal to the resonant frequency of the tuned IF stages. In the conventional FM receiver circuitry, the output frequency of the local oscillator is not affected by the operation of the FM detector stage. However, because of the interconnection of the output terminal OT of RD to the base electrode of TO via isolating resistor RA in accordance with the present invention the base voltage of transistor TO varies in accordance with the D.C. potential of output terminal OT.

This D.C. potential present at OT constitutes a composite signal comprising first a D.C. level relative to circuit ground which varies in amplitude and at a frequency corresponding to the detected audio signal. However, there is a second component of this varying D.C. signal at OT which varies at a much lower rate and as a function of receiver mistuning or shift in the oscillator frequency from the center IF frequency plus or minus the preselected received signal frequency. That is, if the beat difference frequency between the preselected received signal frequency and the frequency of the local oscillator is lower or higher than the frequency to which the IF stages are tuned, the value of this D.C. signal component will be plus or minus relative to the level of this D.C. component if the frequency of the converted signal fed to the IF stages is equal to the tuned resonant IF frequency. Moreover, this change of D.C. potential at OT has an amplitude which is a function of the magnitude of the receiver mistuning or shift from center IF frequency. Thus, by connecting the output terminal OT to the base of transistor TO the base voltage will be varied automatically in response to mistuning of the local oscillator and with a polarity which is a function of the direction of the deviation. This base voltage variation causes a commensurate change in collector current of TO. The transconductance of a transistor is usually quite high and small changes in base voltage effect large changes in collector current. The variation in this current through R6 causes the collector voltage to change in response to collector current. The collector depletion layer and output capacity of the transistor will vary in accordance with the collector voltage, thereby changing the resonant frequency of the oscillator stage LO. Thus, means are provided for varying the output frequency of the local oscillator automatically to compensate for or correct mistuning of the FM receiver.

Inasmuch as the output signal present on output terminal OT also varies as noted above in accordance with the audio output signal of detector RD, and it is desirable to avoid having the base voltage of TO vary at this audio rate, a capacitor CA (having a low impedance to audio frequency, e.g., a capacitance in the order of 2 mfd.) is connected from the base electrode of TO to ground. The audio frequencies are thus bypassed to ground and the voltage of the base of LO varies only in accordance with the D.C. potential component at OT which is a function of mistuning.

It is also preferred that the ratio detector stage be operated at a D.C. potential above ground which corresponds to the fixed D.C. base bias of TO. Thus the lower terminal of the grain or volume control potentiometer P is shown connected to the junction of two voltage divider resistors RB and RD, connected in series from the negative polarity terminal of the D.C. power source for the receiver. This arrangement provides static bias for the base of TO via an AFC "IN" contact of an AFC switch S and avoids unbalance in the ratio detector stage. In order to avoid any variation in the fixed D.C. bias potential at the junction of RB and RD, a large capacitance (e.g., in the order of 100 mfd.) decoupling capacitor CB is connected in shunt with RD to by-pass any transitory potential variations to ground. The other position of switch S, indicated by AFC "OUT," permits defeating the AFC circuit where, for example, selective tuning of two FM stations on immediately adjacent frequencies is desired. A potentiometer PA is interconnected between the AFC "OUT" stator contact of switch S so that the fixed D.C. base bias of TO can be adjusted to the same D.C. level as it is in AFC "IN" when the receiver is accurately tuned. This avoids a shift in the output frequency of LO when switch S is operated. Shown in phantom by dashed lines is a resistor RX of relatively high resistance (e.g., in the order of 120,000 ohms) which may be added optionally in the oscillator base circuit to reduce the amount of oscillator D.C. base current that flows in the detector circuit and thereby reduce the change in detector operating point produced if the D.C. current is appreciable. This allows the use of a low beta transistor in the oscillator circuit.

The effectiveness of the operation of the AFC system of this invention to automatically effect a shift in the resonant frequency of the local oscillator to compensate for drifting, shifting, or mistuning thereof is illustrated in FIG. 2. Assuming a preselected center frequency of 100 mc. to which the FM receiver is tuned, the mistuning of the local oscillator LO is plotted along the abscissae as deviation in mc. vs. relative audio output along the ordinate. Curve X (dashed-dot line) represents the tuning characteristic of an FM receiver without the AFC system operating (i.e., switch S in the AFC "OUT" position) including a side response at the right or low frequency side of the graph. It will be noted that the receiver tuning is quite critical with a sharp fall-off in audio output with only .1 mc. drift or mistuning. With switch S in the AFC "IN" position the tuning characteristics of the receiver are shown by the solid-line curve Y (as the center frequency is approached from the low frequency end) and the dashed-line curve Z (as the center frequency is approached from the high frequency end). It will be noted that the tuning characteristic curve of the receiver with the AFC system of the present invention operating has a broad flat crest spanning about .5 mc. on each side of center frequency, thus illustrating the highly desirable pull-in characteristics of an FM receiver constructed in accordance with our invention. These curves therefore aptly illustrate the highly effective automatic stabilization of an FM receiver against any of the many factors, such as temperature, battery voltage, etc., changes which cause undesirable frequency shifts in the local oscillator.

It will be understood that without departing from the scope of our invention other means may be employed for obtaining a D.C. potential which is proportional to FM receiver drift or mistuning. For example, the audio output of phase discriminator detector stages may be used as will be apparent to those familiar with this art. It will also be noted that transistors other than the PNP type illustrated herein are equivalent for the purposes of this invention.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

We claim:

1. In an FM receiver including a transistor local oscillator stage and an FM detector stage with an output terminal having a varying potential relative to circuit ground which constitutes the receiver audio signal and which has a D.C. voltage component with a magnitude proportional to mistuning of said local oscillator, said transistor having base, collector and emitter electrodes; an AFC circuit comprising an isolating resistor interconnecting said terminal and said base electrode adapted to apply said D.C. voltage signal component to the base of said transistor, a decoupling capacitor interconnected between said base and circuit ground adapted to by-pass the audio signal around the base-emitter circuit, a resistor interconnecting said terminal and a fixed D.C. bias supply thereby providing a static bias for said transistor oscillator whereby a shift in said D.C. voltage signal component varies the collector current and output capacitance of said transistor as a function thereof to effect a compensating shift in the resonant frequency of said oscillator, and switch means adapted in a first position to disconnect said isolating resistor from said base electrode and interconnect said base electrode to a variable D.C. potential source, said switch means adapted in a second position to reconnect said isolating resistor to said base electrode and disconnect said variable D.C. potential source from said base electrode.

2. In an FM receiver as set forth in claim 1, an AFC circuit in which said FM detector stage is a ratio detector.

References Cited by the Examiner

UNITED STATES PATENTS

| | | | |
|---|---|---|---|
| 2,764,687 | 9/56 | Buchanan et al. | 331—8 |
| 2,768,296 | 10/56 | Herzog | 331—8 |
| 2,774,867 | 12/56 | Loughlin | 329—129 |
| 2,857,573 | 10/58 | Lin | 332—18 |
| 2,915,631 | 12/59 | Nilssen | 329—129 |
| 2,951,995 | 9/60 | Rosier et al. | 332—16 |
| 3,010,073 | 11/61 | Melas | 331—8 |
| 3,094,662 | 6/63 | Young | 325—319 |

OTHER REFERENCES

Stoner: "Portable Transistor FM Receiver," Electronic World, March 1960, pages 61 to 62.

DAVID G. REDINBAUGH, *Primary Examiner.*

SAMUEL B. PRITCHARD, ROY LAKE, *Examiners.*